United States Patent
Ashida et al.

(10) Patent No.: US 6,333,529 B1
(45) Date of Patent: *Dec. 25, 2001

(54) CAPACITOR WITH NOBLE METAL ELECTRODE CONTAINING OXYGEN

(75) Inventors: Hiroshi Ashida; Miki Tomotani, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,266

(22) Filed: Feb. 26, 1999

(30) Foreign Application Priority Data

Feb. 27, 1998 (JP) .................................. 10-048197

(51) Int. Cl.$^7$ ................................................ H01L 29/94
(52) U.S. Cl. .......................... 257/295; 257/306; 257/310
(58) Field of Search .................................. 257/303, 300, 257/306, 310

(56) References Cited

U.S. PATENT DOCUMENTS

| 5,555,486 | * | 9/1996 | Kingon et al. | 361/305 |
| 5,864,153 | * | 1/1999 | Nagel et al. | 257/296 |
| 5,905,278 | * | 5/1999 | Nakabayashi | 257/296 |
| 5,929,475 | * | 7/1999 | Uemoto et al. | 257/295 |
| 5,973,911 | * | 10/1999 | Nishioka | 361/313 |

FOREIGN PATENT DOCUMENTS

| 5-343616 | 12/1993 | (JP) . |
| 7-263570 | 10/1995 | (JP) . |
| 08-037282 | 2/1996 | (JP) . |
| 8-55967 | 2/1996 | (JP) . |
| 8-274270 | 10/1996 | (JP) . |
| 9-64291 | 3/1997 | (JP) . |

* cited by examiner

Primary Examiner—Steven Loke
Assistant Examiner—Douglas W. Owens
(74) Attorney, Agent, or Firm—Armstrong, Westerman, Hattori, McLeland & Naughton, LLP

(57) ABSTRACT

The present invention relates to a method of manufacturing a semiconductor device including steps of fabricating a capacitor. In a semiconductor device having a capacitor, the capacitor includes a lower electrode, a dielectric oxide film formed on the lower electrode, and an upper electrode formed the dielectric oxide film and formed of at least platinum in which oxygen is contained at a concentration of more than $1 \times 10^{20}$ atoms/cm$^3$. Accordingly, peeling of the upper electrode can be prevented and electric characteristics of the capacitor can be improved.

14 Claims, 9 Drawing Sheets

(1) After Formation of the Capacitor
(2) After Opening of the Interlayer Film
(3) After Oxygen Annealing
(4) After Wiring

CAPACITOR WITH NOBLE METAL ELECTRODE CONTAINING OXYGEN

BACKGROUND OF THE INVENTION

1. Field of the Invention

The present invention relates to a semiconductor device and a method of manufacturing a semiconductor device and, more particularly, a semiconductor device and a method of manufacturing a semiconductor device I including steps of fabricating a capacitor.

2. Description of the Prior Art

There is an FeRAM (Ferroelectric Random Access Memory) as the nonvolatile semiconductor memory device. The FeRAM comprises a capacitor having a high-ferroelectric film and a memory cell formed of an n-type MOS transistor. As such high-ferroelectric material, PZT, PLZT, etc. which have a perovskite structure, for example, are employed. Such high-ferroelectric film is formed by the sputtering method, the CVD method, the sol-gel process, etc. Since the high-ferroelectric film must be oxidized and crystallized in the high-temperature oxygen atmosphere, platinum (Pt), ruthenium (Ru), iridium (Ir), or the like, which is difficult to be oxidized or which does not lose conductive property even if oxidized, is employed as electrode material.

PZT is short for lead zirconate titanate ($Pb(Zr_xTi_{1-x})O_3$). PLZT is PZT in which lanthanum is added, and its chemical formula is $Pb_yLa_{1-y}(Zr_xTi_{1-x})O_3$.

By way of example, the semiconductor memory device employing the high-ferroelectric capacitor is manufactured by the steps described in the following.

First, as shown in FIG. 1A, an n-type MOS transistor 2 is formed on a silicon substrate 1. The n-type MOS transistor 2 is formed in a region which is surrounded by a device isolation insulating layer 6 on a surface of the silicon substrate 1. The n-type MOS transistor 2 comprises a gate electrode which is formed on the silicon substrate 1 via a gate insulating film 3, and a source region 5s and a drain region 5d which are formed in the silicon substrate 1 on both sides of the gate electrode 4.

The gate electrode 4 constitutes a part of a word line WL, and remaining portion of the word line WL is positioned to pass through on the device isolation insulating layer 6.

After the n-type MOS transistor 2 and the word line WL have been formed, an interlayer insulating film 7 is formed to cover the n-type MOS transistor 2, the word line WL, etc., as shown in FIG. 1B.

Then, steps needed until a configuration shown in FIG. 1C is formed will be explained hereunder.

A first platinum (Pt) layer 8 and a PZT layer 9 are then grown in sequence on the interlayer insulating film 7 over the device isolation insulating layer 6 which is formed adjacent to the n-type MOS transistor 2. A resultant structure is then annealed in the oxygen atmosphere to crystallize the PZT layer 9. A second platinum layer 10 is then formed on the PZT layer 9.

After this, the second platinum layer 10 is patterned by using the photolithography technology which employs an etching gas and a resist mask. The patterned second platinum layer 10 is employed as an upper electrode of the capacitor.

The PZT layer 9 is then patterned by using the photolithography technology to shape a dielectric layer of the capacitor. A lower electrode of the capacitor is then formed by patterning the first platinum layer 8 by using the photolithography technology.

With the above, patterning of the capacitor has been completed.

A protection insulating film 11 formed of $SiO_2$ is then grown on an overall surface by the chemical vapor deposition using TEOS (Tetraethoxysilane). As shown in FIG. 1D, a first opening portion 11a and a second opening portion 11b are then formed by patterning the protection insulating film 11 such that the second platinum layer (upper electrode) 10 is exposed from the first opening portion 11a and also the first platinum layer (lower electrode) 8 is exposed from the second opening portion 11b.

As shown in FIG. 1E, a third opening portion 11g, a fourth opening portion 11d, and a fifth opening portion 11s are then formed by patterning the protection insulating film 11 and the interlayer insulating film 7 to expose the gate electrode (word line WL), the drain region 5d, and the source region 5s respectively.

In turn, an aluminum layer is formed on an overall surface. As shown in FIG. 1F, wirings 12a, 12b, 12s, 12d, 12g made of aluminum are then formed by patterning the aluminum layer by using the photolithography.

The above steps have been set forth in Patent Application Publication (KOKAI) hei 8-37282, for example, etc.

In the semiconductor memory device having the above-mentioned configuration, the capacitor is heated and exposed to the reduction atmosphere inevitably in the step of forming the protection insulating film 11, the step of forming the opening portions 11a, 11b, etc. to reduce residual polarization charge in the PZT layer 9. Therefore, electric characteristics of the capacitor are degraded.

The upper electrode 10 is ready to peel if it is subjected to the step of forming the protection insulating film 11 and various subsequent steps.

SUMMARY OF THE INVENTION

It is an object of the present invention to provide a method of manufacturing a semiconductor device which is capable of preventing peeling of an upper electrode and thus improving electric characteristics of a capacitor.

In order to achieve the above object, there is provided a semiconductor device comprising a capacitor, wherein the capacitor includes a lower electrode, a dielectric oxide film formed on the lower electrode, and an upper electrode formed on the dielectric oxide film and formed of at least a noble metal containing oxygen having a concentration of more than $1\times10^{20}$ atoms/cm$^3$.

In order to achieve the above object, there is provided a method of manufacturing a semiconductor device comprising the steps of forming an insulating film over a semiconductor substrate; forming a lower electrode on the insulating film; forming a dielectric oxide film on the lower electrode; forming an upper electrode made of at least a noble metal on the dielectric oxide film; patterning the lower electrode, the dielectric oxide film, and the upper electrode; covering the lower electrode, the dielectric oxide film, and the upper electrode with an insulating protection film; forming an opening by patterning the insulating protection film to expose at least a part of the upper electrode; and supplying an oxygen to the upper electrode and the dielectric oxide film via the opening to set a concentration of oxygen contained in the upper electrode to $1\times10^{20}$ atoms/cm$^3$ or more.

According to the present invention, the upper electrode is formed on the dielectric oxide film and made of at least a noble metal such as platinum, iridium, etc., and the oxygen concentration contained in the upper electrode is set to more than $1 \times 10^{20}$ atoms/cm$^3$.

Accordingly, it has been confirmed based on the experiment that the upper electrode becomes difficult to peel from the dielectric oxide film.

In this case, if the oxygen concentration in the dielectric oxide film is set to $5 \times 10^{19}$ toms/cm$^3$, residual polarization charge to stabilize an operation of the FeRAM can be achieved.

Adjustment of the oxygen concentration can be performed by annealing the structure in the oxygen containing atmosphere after the capacitor having the dielectric oxide film is formed and then the electrode connecting opening portion is formed in the protection film.

BRIEF DESCRIPTION OF THE DRAWINGS

FIGS. 8A to 8F.

DESCRIPTION OF THE PREFERRED EMBODIMENTS

Embodiments of the present invention will be explained in detail with reference to the accompanying drawings hereinafter.

At first, it has been studied under what conditions residual polarization charge of the capacitor employing PZT as a dielectric film and electrode peeling are varied. The capacitor employed in such study has a configuration shown in FIG. 2.

Figure 1A:
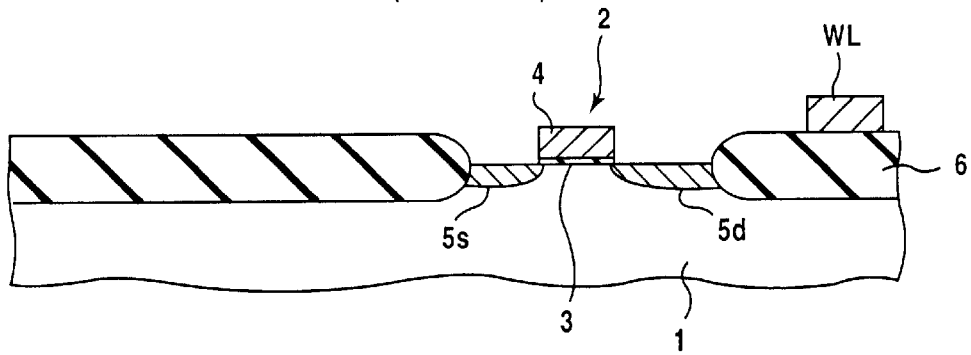
FIGS. 1A to 1F are sectional views showing steps of manufacturing the FeRAM cell in the prior art.
Figure 1B:
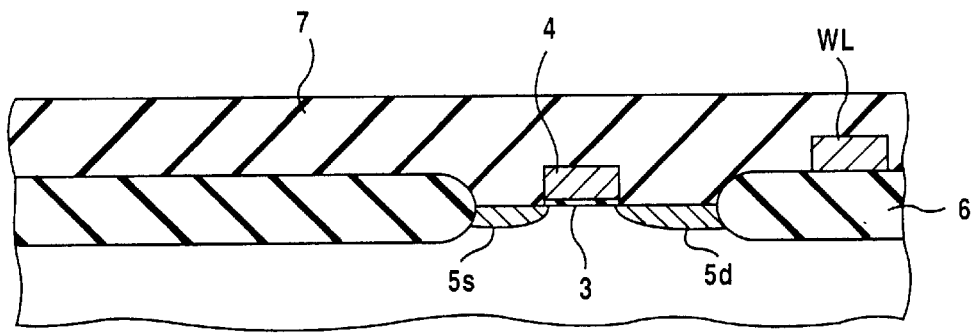
Figure 1C:
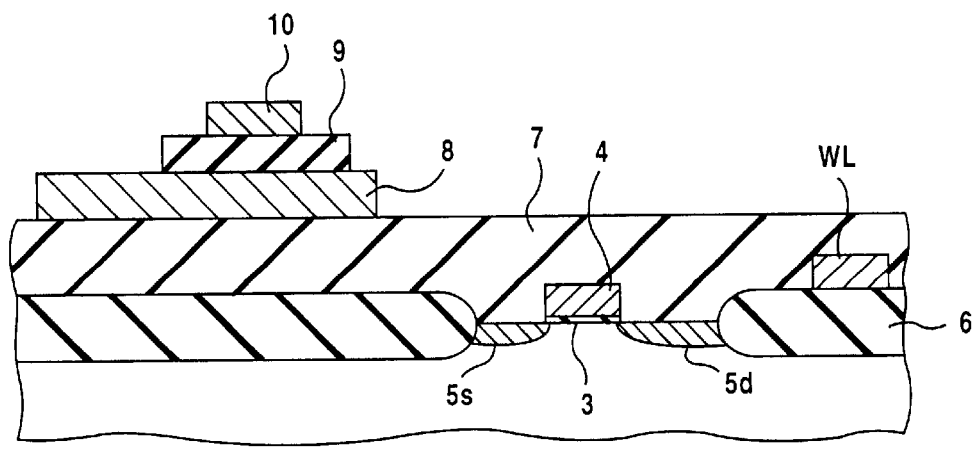
Figure 1D:
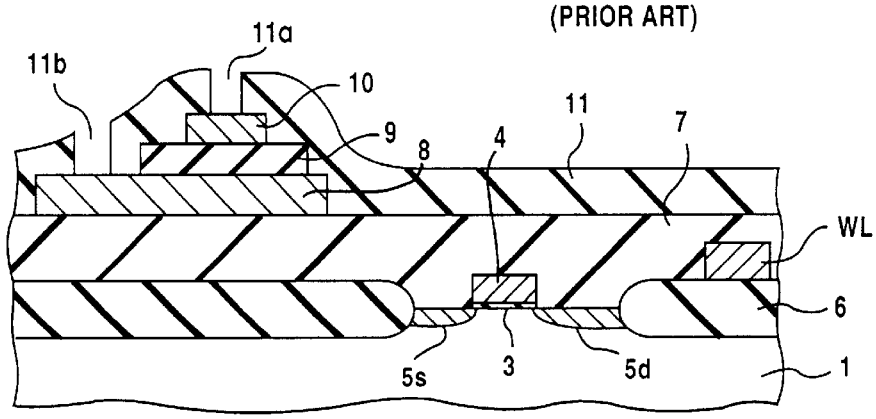
Figure 1E:
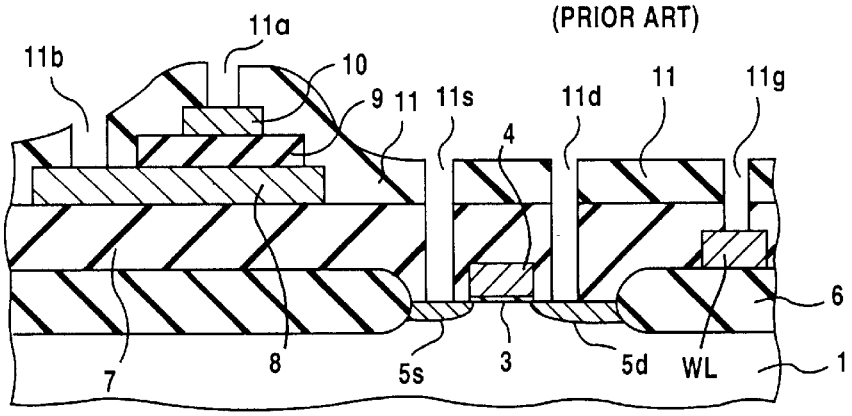
Figure 1F:
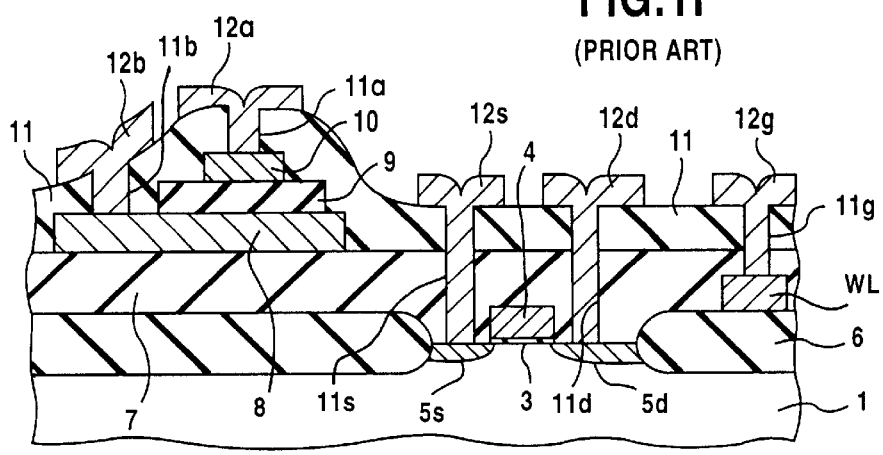
Figure 2:
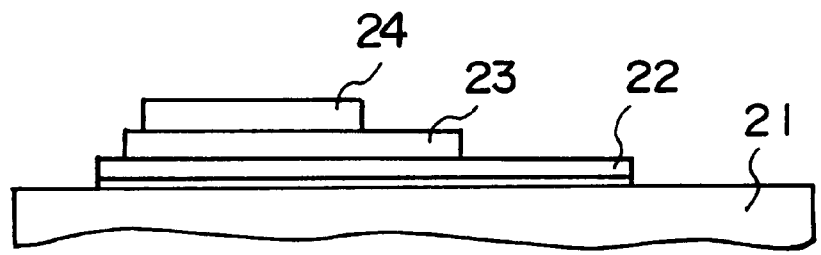
FIG. 2 is a sectional view showing a basic configuration of a capacitor which is employed to check residual polarization charge and peeling of an upper electrode in the capacitor according to the present invention.

In FIG. 2, a lower electrode 22 of a double-layered structure, a dielectric film 23 formed of PZT having a thickness of 200 nm, and an upper electrode 24 formed of platinum having a thickness of 100 nm are formed in order on an underlying film 21 formed of silicon oxide. A part of the lower electrode 22 is exposed from the dielectric film 23 and the upper electrode 24. The double-layered structure of the lower electrode 22 is composed of a titanium film of 30 nm thickness and a platinum film of 180 nm thickness in sequence from the bottom.

Figure 3:
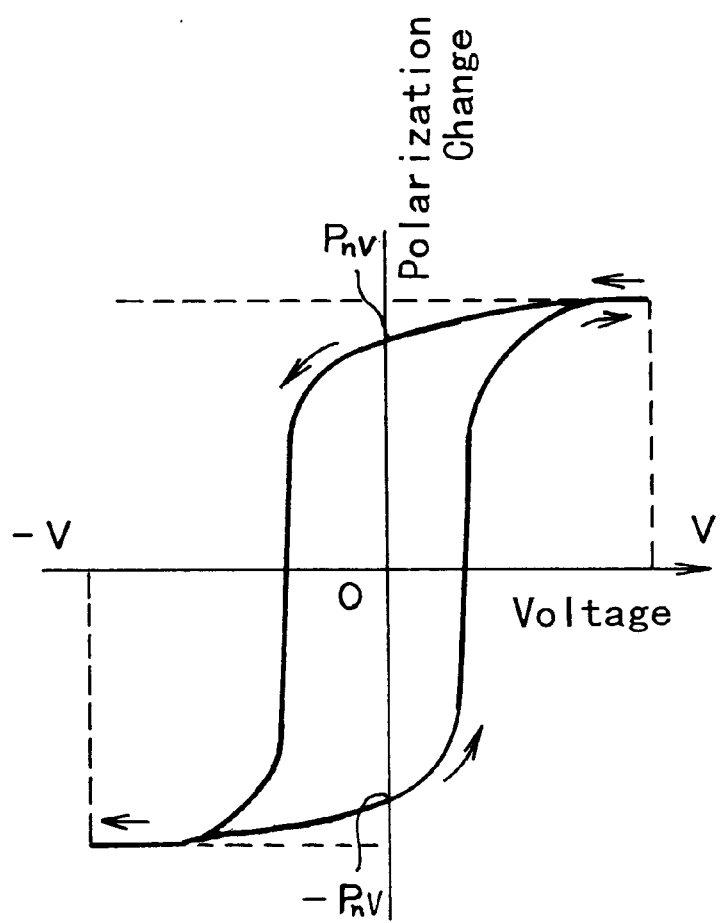
FIG. 3 is a characteristic view showing a relationship between an applied voltage to the capacitor and the polarization charge.

When a voltage applied between the lower electrode 22 and the upper electrode 24 of the capacitor having the above structure is changed continuously between −V and +V, a relationship between polarization charge and of the capacitor and the applied voltage has a hysteresis characteristic, as shown in FIG. 3. In FIG. 3, the polarization charge which appears when the voltage is set to zero is referred to as "residual polarization charge Pnv" hereinafter.

TABLE 1

| Sample No. | (1) Initial Pnv($\mu$C/cm$^2$) | (2) After N$_2$ or N$_2$ + H$_2$ annealing Pnv($\mu$C/cm$^2$) | (3) After O$_2$ annealing Pnv($\mu$C/cm$^2$) |
|---|---|---|---|
| 1 | 25.4 | 25.6 (N$_2$) | — |
| 2 | 25.4 | 21.5 (N$_2$) | — |
| 3 | 24.4 | 25.0 (N$_2$+H$_2$) | 24.0 |
| 4 | 24.3 | 19.2 (N$_2$+H$_2$) | 24.0 |
| 5 | 24.4 | 1.98 (N$_2$+H$_2$) | 24.0 |
| 6 | 26.8 | 0.35 (N$_2$+H$_2$) | 26.0 |

Six types of sample having such capacitor, i.e., first to sixth samples are prepared in plural respectively. When the residual polarization charge Pnv of the first to sixth capacitors has been measured in initial state after preparation, values shown in the column (1) of Table 1 have been derived. In this case, a planar area of the upper electrode 24 of the sample is set to $5 \times 10_{-5}$ cm$^2$.

The first and second samples are then annealed in the nitrogen atmosphere at different substrate temperatures respectively. In this case, the substrate temperature of the first sample is set to 200° C. and the substrate temperature of the second sample is set to 400° C. When the residual polarization charges Pnv of the first sample and the second sample obtained immediately after the nitrogen annealing have been measured, the results shown in the column (2) of Table 1 have been derived.

In addition, the capacitors of third to sixth samples are annealed in the nitrogen/hydrogen atmosphere at different temperatures. In this case, the substrate temperature of the third sample is set to 100° C., the substrate temperature of the fourth sample is set to 150° C., the substrate temperature of the fifth sample is set to 200° C., and the substrate temperature of the sixth sample is set to 250° C. When the residual polarization charges Pnv of the third to sixth samples obtained immediately after the nitrogen/hydrogen annealing have been measured, the results shown in the column (3) of Table 1 have been derived.

Respective conditions of the nitrogen annealing and the nitrogen/hydrogen annealing are listed in Table 2. An annealing time is 30 minutes.

TABLE 2

Conditions of $N_2$ annealing or $N_2 + H_2$ annealing

| Sample No. | Gas pressure (Total pressure 7.6 Torr) | Temperature |
|---|---|---|
| 1 | $N_2$: 7.6 Torr | 200 °C. |
| 2 | $N_2$: 7.6 Torr | 400 °C. |
| 3 | $H_2$: 350 mTorr, $N_2$: 7.25 Torr | 100 °C. |
| 4 | $H_2$: 350 mTorr, $N_2$: 7.25 Torr | 150 °C. |
| 5 | $H_2$: 350 mTorr, $N_2$: 7.25 Torr | 200 °C. |
| 6 | $H_2$: 350 mTorr, $N_2$: 7.25 Torr | 250 °C. |

Then, when peeling test of the upper electrode 24 of the capacitors in the first and second samples, which have been subjected to the nitrogen annealing, and the third to sixth samples, which have been subjected to the nitrogen/hydrogen annealing, has been done, the results shown in the column (1) of Table 3 have been derived. Peeling of the upper electrode 24 is checked by sticking an adhesive tape on the upper electrode 24 and then stripping off the adhesive tape. In other words, it has been decided that the upper electrode 24 peels off if the upper electrode 24 is stuck onto the adhesive tape, while it has been decided that the upper electrode 24 does not peel off unless the upper electrode 24 is stuck onto the adhesive tape.

TABLE 3

| Sample No. | (1) Pt film peeling test after $N_2$ annealing or $N_2 + H_2$ annealing | (2) Pt film peeling test After $O_2$ annealing |
|---|---|---|
| 1 | No peeling | — |
| 2 | No peeling | — |
| 3 | No peeling | No peeling |
| 4 | No peeling | No peeling |
| 5 | Peeling | No peeling |
| 6 | Peeling | No peeling |

Next, the third to sixth samples which have been subjected to the nitrogen/hydrogen annealing are further annealed in the oxygen atmosphere. When the residual polarization charge is measured, the results shown in the column (3) of Table 1 have been derived.

In addition, when the peeling test of the upper electrode 24 of the third to sixth samples which are subjected to the oxygen annealing is effected, the results shown in the column (2) of Table 3 have been derived. Thus, no peeling is caused in the upper electrodes 24 of the fifth and sixth samples.

In the Table 3 (1), the upper electrodes 24 of the third and fourth samples become difficult to peel, because the reduction reaction is insufficient due to the low substrate temperature.

Conditions of the oxygen annealing are shown in Table 4.

TABLE 4

Oxygen ($O_2$) annealing conditions

| Sample No. | Gas pressured | Temperature | Time |
|---|---|---|---|
| 1 | — | — | 0 |
| 2 | — | — | 0 |
| 3 | 1 atm | 400° C. | 30 min |
| 4 | 1 atm | 400° C. | 30 min |
| 5 | 1 atm | 400° C. | 30 min |
| 6 | 1 atm | 400° C. | 30 min |

With the above, the residual polarization charge can be reduced by annealing the capacitor in the hydrogen containing atmosphere, i.e., reduction atmosphere. An amount of reduction of the residual polarization charge is increased as the substrate temperature is made higher. Meanwhile, when the residual polarization charge obtained after the oxygen annealing is checked, an amount of the residual polarization charge is substantially restored to the residual polarization charge obtained at the initial preparation of the sample. In order to check this cause, the experiment described in the following has been carried out.

Figure 4:
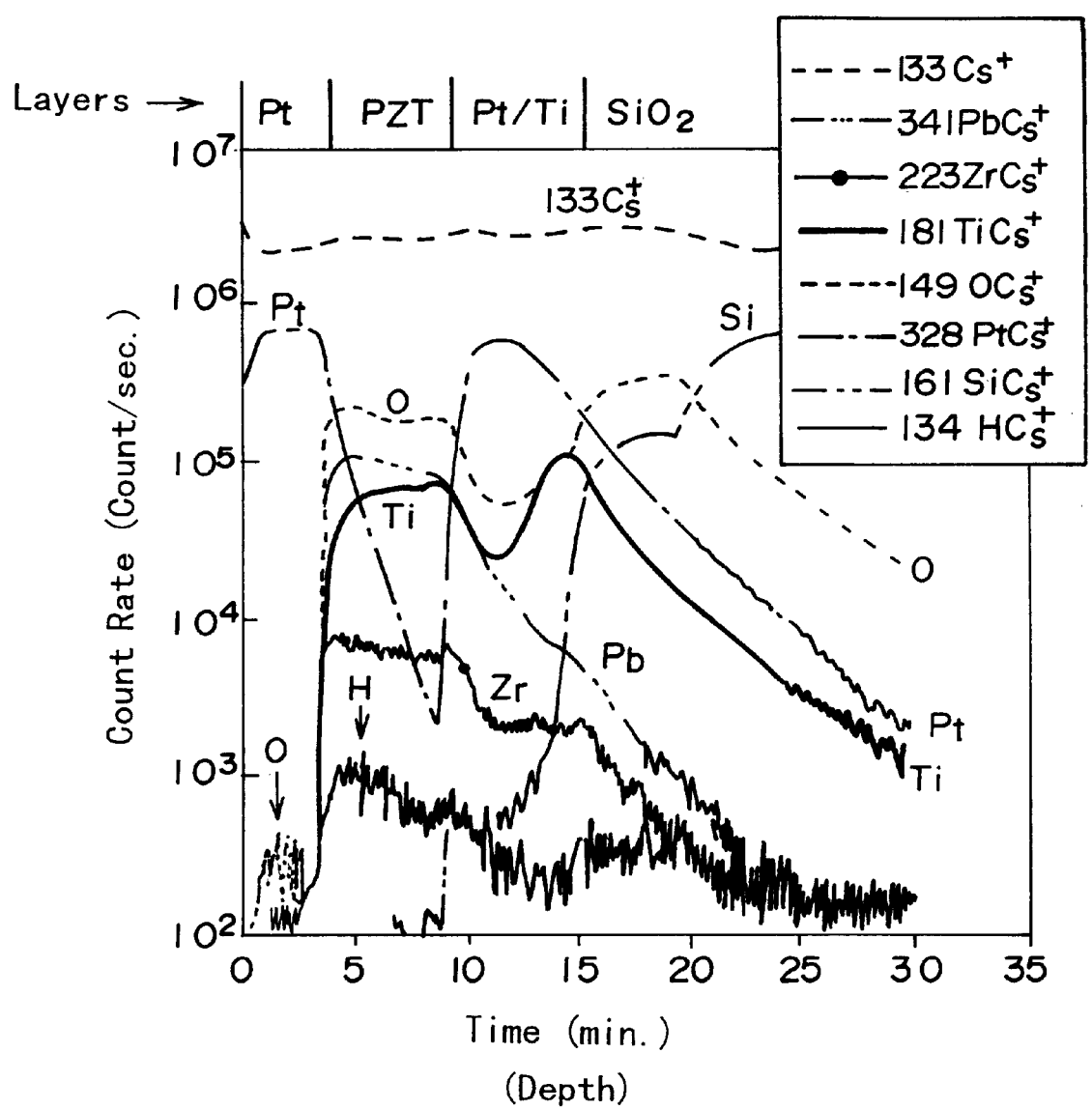
FIG. 4 is a view showing composition distribution in respective films constituting the capacitor by virtue of SIMS analysis after annealing of the capacitor according to the present invention in a hydrogen containing atmosphere has been completed.

To begin with, when composition analysis of the capacitor obtained directly after the nitrogen/hydrogen annealing is carried out by the SIMS (Secondary Ion Mass Spectrometry) analysis, composition distribution shown in FIG. 4 has been derived. In order to make clear the influence of hydrogen reduction, in this composition analysis, the partial pressure of hydrogen is set to 740 mTorr higher than the nitrogen/hydrogen annealing shown in Table 2, and the samples are heated at the heating temperature of 200° C. for 30 minutes.

According to FIG. 4, after the nitrogen/hydrogen annealing, it has become apparent that an amount of hydrogen in PZT constituting the dielectric film 23 can be enhanced, but an amount of oxygen in the platinum film constituting the upper electrode 24 can be reduced.

It may be supposed that adhesiveness between the upper electrode 24 and the dielectric (PZT) film 23 can be kept higher when platinum in the upper electrode 24 is slightly oxidized as $PtO_x$ whereas such adhesiveness between the upper electrode 24 and the dielectric (PZT) film 23 is lowered when this $PtO_x$ is reduced into Pt, whereby the upper electrode 24 is ready to peel.

Figure 5:
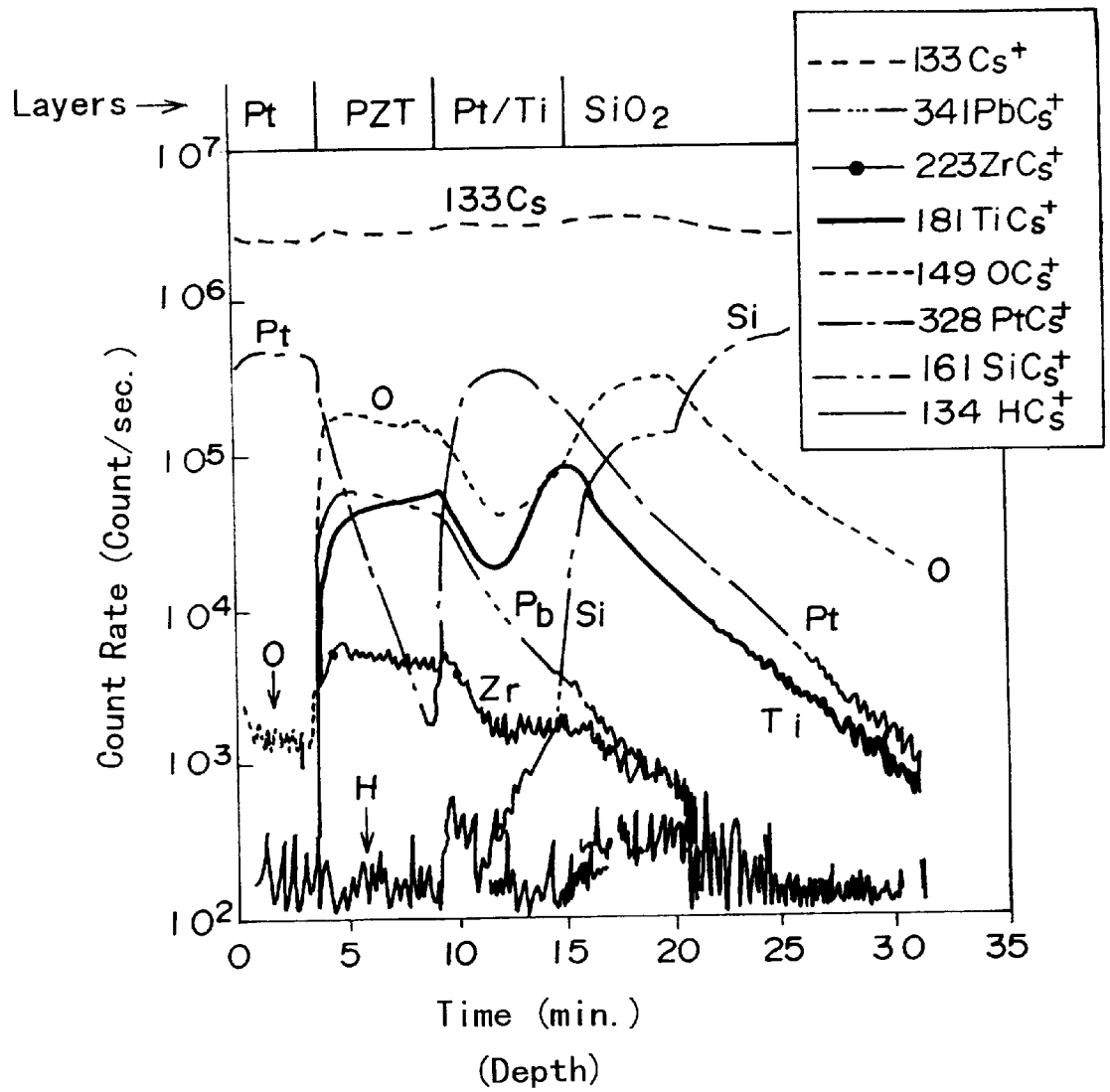
FIG. 5 is a view showing composition distribution in respective films constituting the capacitor by virtue of SIMS analysis after oxygen annealing of the capacitor according to the present invention has been completed.

This is evident from the fact that, when the samples which are degraded in the reduction atmosphere are further annealed and then analyzed by virtue of the SIMS analysis, composition distribution shown in FIG. 5 can be derived and also an amount of oxygen contained in the platinum film constituting the upper electrode 24 can be increased.

In the SIMS analysis shown in FIGS. 4 and 5, $Cs^+$ ions which are generated at conditions of 3.5 V and 3.0 A are employed as the primary ion.

Such result can be derived from the above discussion that adhesiveness between the $PtO_x$ film, which is obtained by oxidizing the platinum film, and the PZT film becomes better.

Figure 6:
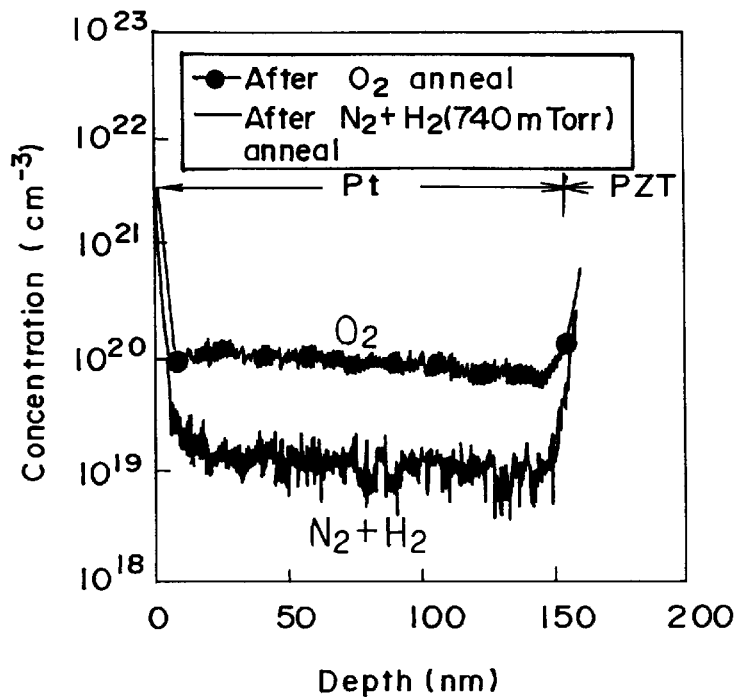
FIG. 6 is a view showing respective distributions of oxygen concentration in the upper electrode after annealing of the capacitor according to the present invention in the hydrogen containing atmosphere has been completed and oxygen concentration in the upper electrode after the upper electrode has been annealed in oxygen containing atmosphere.

Then, peeling tests of two types of the platinum film and the PZT film, which has the oxygen concentration shown in FIG. 6, have been effected. As a result, adhesiveness between the platinum film and the PZT film has become good if the oxygen concentration in the platinum film is $1 \times 10^{20}$ atoms/cm$^3$, but the platinum film and the PZT film has been ready to peel mutually if the oxygen concentration in the platinum film is $1 \times 10^{19}$ atoms/cm$^3$.

Platinum is material which is a hard to be oxidized. Hence, if the oxygen is contained in the platinum film, such platinum film is never brought into its high resistance state to make a function of the electrode lose.

Figure 7:
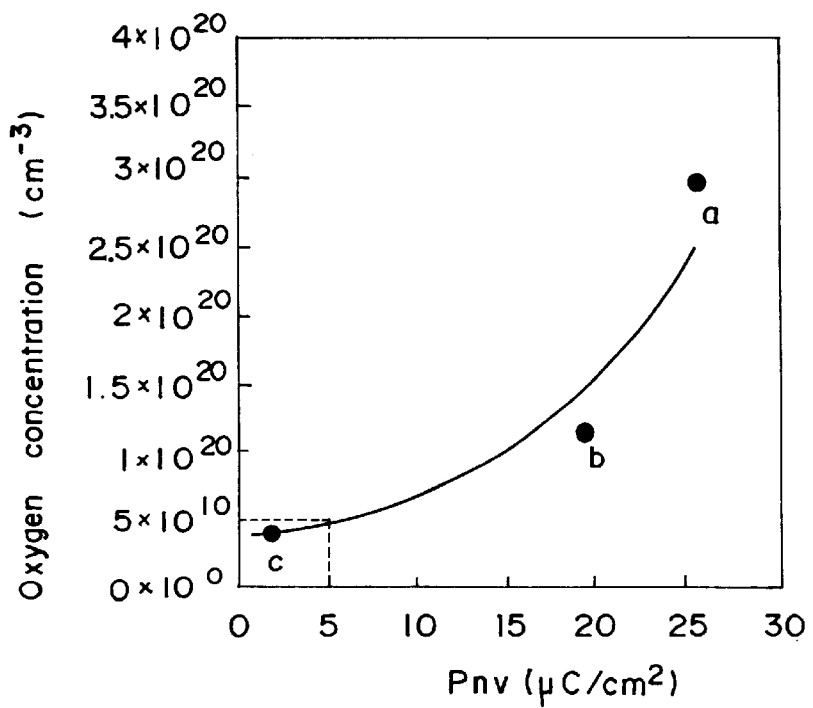
FIG. 7 is a view showing a relationship between the residual polarization charge and the oxygen concentration in the dielectric oxide film constituting the capacitor according to the present invention.

Next, when a relationship between the residual polarization charge and the oxygen concentration in the dielectric oxide film 23 is derived, the result shown in FIG. 7 has been obtained.

In FIG. 7, a plot c denotes a value of the fifth sample shown in Table 1 detected immediately after the nitrogen/oxygen annealing. In this case, the peeling of the upper electrode 24 is caused. Also, a plot b denotes a value of the fourth sample shown in Table 1 detected immediately after the nitrogen/oxygen annealing. In this case, the peeling of the upper electrode 24 is not caused. Further, a plot a denotes a value detected immediately after the oxygen annealing. In this case, the peeling of the upper electrode 24 is not caused.

According to FIG. 7, the oxygen concentration in the dielectric (PZT) film 23 must be set to more than $5 \times 10^{19}$ atoms/cm$^3$. This is because the residual polarization charge in excess of 5 μC/cm$^2$ is needed in the FeRAM circuit in order to render its operation stable.

It can be found from the above discussion that, because the oxygen becomes insufficient by placing the capacitor in the reduction atmosphere, the residual polarization charge of the capacitor can be reduced and also peeling of the upper electrode is caused easily, nevertheless such lack of the oxygen can be supplemented by the succeeding oxygen annealing and therefore the residual polarization charge can be restored and also the peeling of the upper electrode can be suppressed.

Steps of manufacturing the FeRAM cell will be explained with regard to the above experimental results hereunder.

FIGS. 8A to 8F are sectional views showing steps of manufacturing the memory cell of the FeRAM according to the embodiment of the present invention.

Figure 8A:
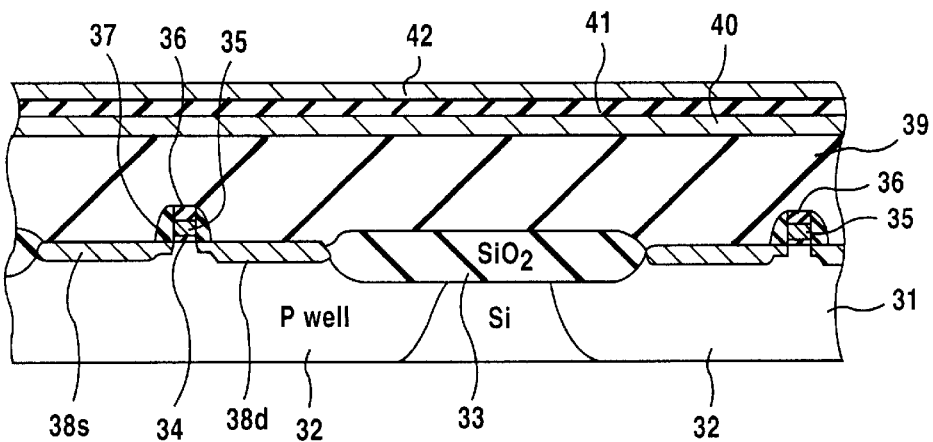
FIGS. 8A to 8F are sectional views showing steps of manufacturing an FeRAM cell which employs the capacitor according to the present invention.

First, steps requested until the n-type MOS transistor shown in FIG. 8A is completed will be explained hereinbelow.

Boron ions are then implanted into a part of region of an n-type silicon substrate 31 under the conditions of acceleration energy 180 keV and a dosage $1.5 \times 10^{13}$ atoms/cm$^2$. The n-type silicon substrate 31 is then placed in the nitrogen atmosphere at 1150° C. for 300 minutes to diffuse the impurity. Accordingly, a p-type well 32 is formed in the silicon substrate 31.

A field oxide film 33 of 500 nm thickness is then formed on a (100) face of the silicon substrate 31 by the selective oxidation method. While covering a device forming region of the p-type well 32 on the silicon substrate 31 with a silicon nitride mask, such field oxide film 33 can be formed in the vapor containing atmosphere at 900° C.

In order to adjust a threshold voltage of the n-type MOS transistor which is formed in the device forming region, impurity is introduced into a channel region in the device forming region by a predetermined amount after the silicon nitride mask has been removed. For example, boron may be employed as such impurity.

In turn, a surface of the silicon substrate 31 is oxidized by the argon partial pressure oxidation method at 1050° C. As a result, a gate oxide layer 34 made of SiO$_2$ is formed in the device forming region to have a thickness of 12 nm.

A polysilicon layer and a silicon oxide layer are then grown by the CVD. At this time, the polysilicon layer is formed as a conductive film by introducing impurity in growth or after growth. A stripe-shaped word line WL is then formed by patterning the polysilicon layer and the silicon oxide layer by using the photo-lithography. The word line WL acts as the gate electrode 35 in the device forming region, and the silicon oxide layer formed thereon acts as a protection film 36.

Then, while using the gate electrode 35 and the field oxide film 33 as a mask, phosphorus ions are implanted into the silicon substrate 31 under the conditions of the acceleration energy 20 keV and the dosage $4 \times 10^{15}$ atoms/cm$^2$ to thus form shallow impurity introducing layers.

An SiO$_2$ layer of 150 nm thickness is then grown on an overall surface by the CVD. The SiO$_2$ layer is then etched back to be left only on side walls of the gate electrode 35 and the protection film 36. The SiO$_2$ layer being left on the side wall is called a sidewall 37 hereinafter.

Then, while using the gate electrode 35, the sidewall 37, the protection film 36, and the field oxide film 33 as a mask, arsenic ions are implanted into the silicon substrate 31 under the conditions of the acceleration energy 70 keV and the dosage $4 \times 10^{15}$ atoms/cm$^2$ to thus form deep impurity introducing layers on both sides of the gate electrode 35 and the sidewall 37.

The silicon substrate 31 is then annealed in the nitrogen atmosphere at the temperature of 850° C. for 40 minutes to activate the shallow impurity introducing layers and the deep impurity introducing layers. As a result, impurity diffusion layers 38s, 38d of an LDD structure are formed.

A basic structure of the n-type MOS transistor shown in FIG. 8A can be completed according to above-mentioned steps.

Then, a silicide film may be formed on surfaces of the impurity diffusion layers 38s, 38d which are not covered with the gate electrode 35 and the sidewall 37.

SiO$_2$ and BPSG (Borophosphosilicate glass) are then grown in sequence as an interlayer insulating layer 39 by the CVD using a reaction gas containing silane to have a thickness of 50 nm and 350 nm respectively. The silicon substrate 31 and respective layers formed thereon are then annealed in the nitrogen atmosphere at the temperature 850° C. for 40 minutes.

Then, 50 nm thick iridium oxide and 150 nm thick platinum are formed by the sputtering to thus form a lower electrode 40.

A PZT sol-gel solution in which $Pb_{1.1}(Zr_{0.45}, Ti_{0.55})_1 O_3$ is contained in a methoxy ethanol solvent by 15 wt % is then spin-coated on the lower electrode 40. A 70 nm thick PZT film is then formed by annealing at the temperature 370° C. for 30 minutes. These processes are repeated four times. The PZT film of 280 nm thickness formed as above is then crystallized by annealing at the temperature 700° C. for one minute to be employed as a dielectric film 41.

Platinum of 175 nm thickness is formed on the dielectric film 41 as an upper electrode 42 by the sputtering. Thus, a configuration shown in FIG. 8A can be implemented.

Figure 8B:
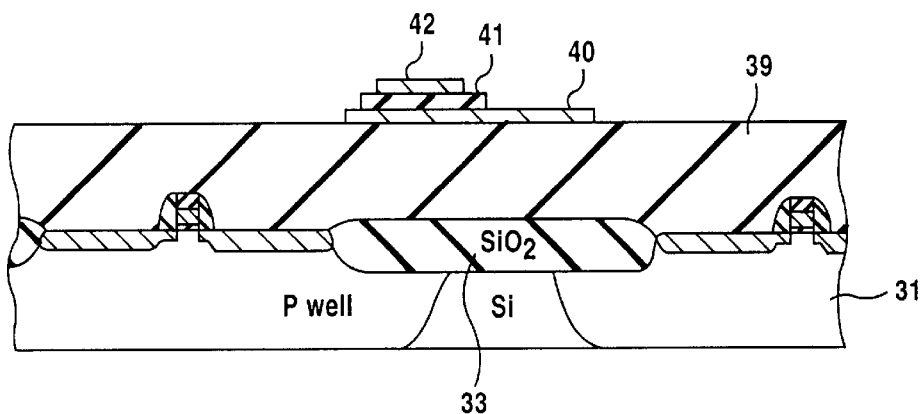

As shown in FIG. 8B, the upper electrode 42, the dielectric film 41, and the lower electrode 40 are patterned. In other words, a resist pattern is formed on the upper electrode 42, and then the upper electrode 42 is shaped into a planar shape of 50×50 μm$^2$ by the plasma etching using Cl$_2$ as an etchant. In addition, the PZT dielectric film 41 is patterned by using another resist pattern and etching, and then a pattern of the lower electrode 40 is defined by using still another resist pattern and etching.

After such twice patterning processes, film quality of the PZT ferroelectric layer 32 is improved by annealing the PZT layer in the oxygen atmosphere at 500° C. for 60 minutes.

With the foregoing processes, basic patterning for the upper electrode 42, the PZT dielectric film 41, the lower electrode 40 constituting the capacitor is completed.

Figure 8C:
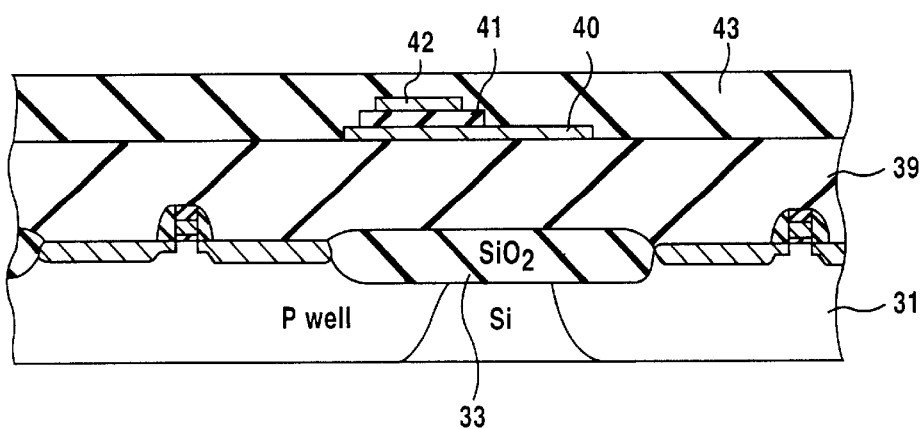

Next, as shown in FIG. 8C, a capacitor protection layer 43 made of SiO$_2$ is formed by the chemical vapor deposition using TEOS (Si(OC$_2$H$_5$)$_4$) to have a thickness of 400 nm. Thus, the capacitor and the n-type MOS transistor are covered with the capacitor protection layer 43.

Since the hydrogen is contained in the TEOS, the upper electrode 42 and the PZT dielectric layer 41 are exposed to the reduction atmosphere.

Figure 8D:
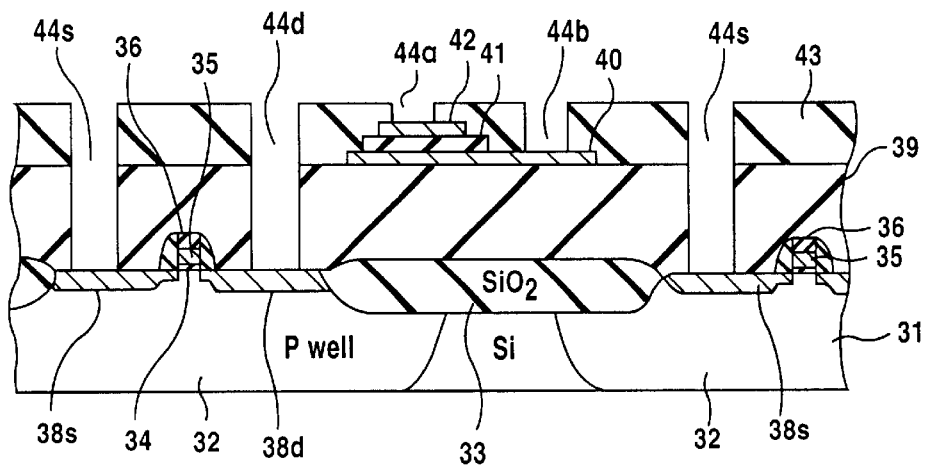

As shown in FIG. 8D, the capacitor protection layer 43 and the interlayer insulating layer 39 are patterned such that a first opening portion 44a is formed on the upper electrode 42, a second opening portion 44b is formed on the lower electrode 40, and third and fourth opening portion 44s, 44d are formed on two impurity diffusion layers 38s, 38d simultaneously.

In order to etch the capacitor protection layer 43 and the interlayer insulating layer 39, a gas such as CHF$_3$ containing fluorine and hydrogen is employed as an etching gas and the plasma etching equipment is employed as an etching equipment. In such patterning, the oxygen in the upper electrode 42 is reduced by the hydrogen contained in the reaction gas and the dielectric layer 41 is ready to be reduced.

The oxygen contained in both the upper electrode 42 and the PZT dielectric layer 41, which are exposed to the reduction atmosphere when the capacitor protection layer 43 is grown and etched as above, is decreased. Therefore, the residual polarization charge mentioned above is reduced and also the peeling of the upper electrode 42 is easily caused.

Figure 8E:
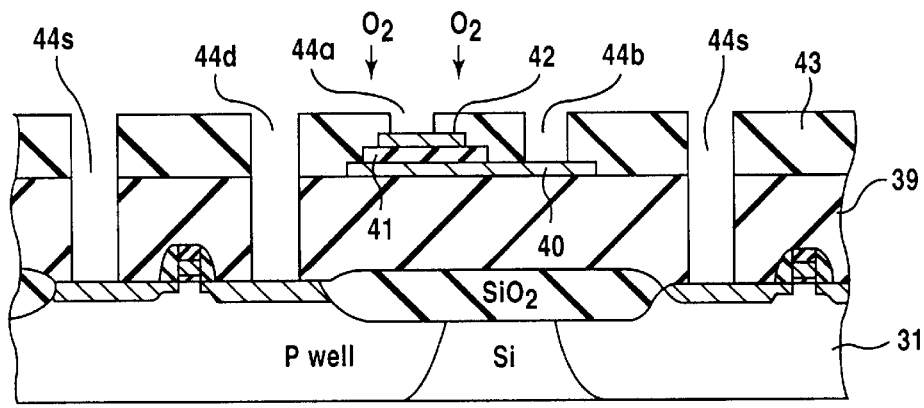

Hence, as shown in FIG. 8E, after the step of forming the opening portions, the oxygen is supplied to the upper electrode 42 and the dielectric layer 41 by annealing the capacitor in the oxygen atmosphere at the atmospheric pressure in the temperature range of 400° C. to 600° C., preferably at 500° C., for 60 minutes. As a result, because of increase in the oxygen amount in the dielectric layer 41, the residual polarization charge can be restored to an initial amount and also the upper electrode 42 formed of platinum can be slightly oxidized, so that the peeling of the upper electrode 42 from the dielectric layer 41 can be prevented. It is preferable that the upper electrode 42 should be formed of PtOx whose oxygen concentration is in excess of $1 \times 10^{20}$ atoms/cm$^3$.

Figure 8F:
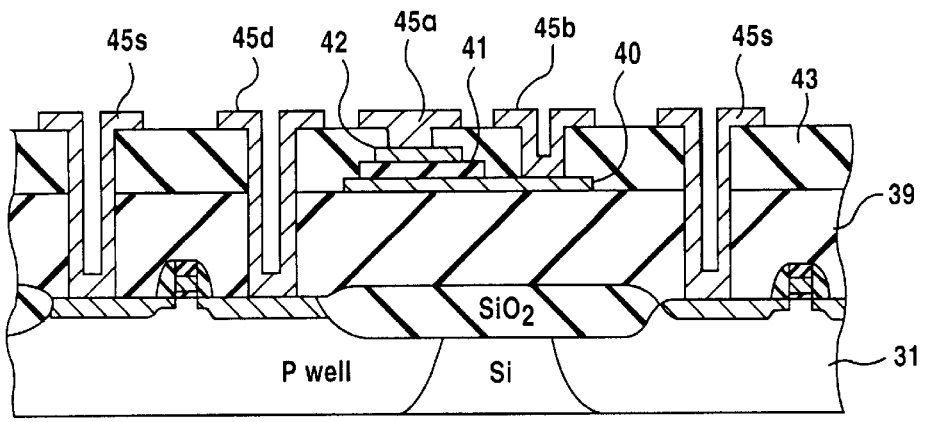

After this, a Ti layer of 20 nm thickness, a TiN layer of 50 nm thickness, an Al layer of 600 nm thickness are formed in sequence on the SiO$_2$ protection layer 34 and in the first to fourth opening portions 44a, 44b, 44s, 44d. The Ti layer, the TiN layer, and the Al layer are then patterned by the normal photolithography. As a result, as shown in FIG. 8F, a first wiring layer 45a which is connected to the upper electrode 42 of the capacitor via the first opening portion 44a is formed, a second wiring layer 45b which is connected to the lower electrode 40 of the capacitor via the second opening portion 44b is formed, a third wiring layer 45s which is connected to the impurity diffusion layer 38s via the third opening portion 44s is formed, and a fourth wiring layer 45d which is connected to the impurity diffusion layer 38d via the fourth opening portion 44d is formed.

Figure 9:
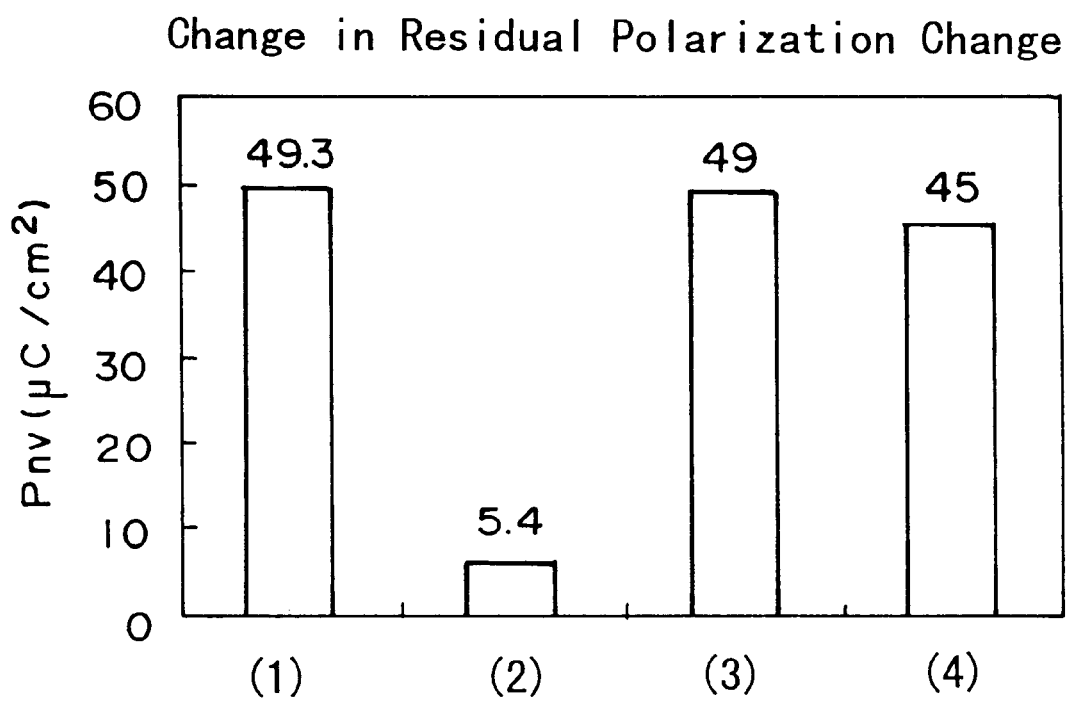
FIG. 9 is a view showing change in the residual polarization charge in the capacitor fabricated in compliance with steps in FIG.

In the course of the foregoing steps, the initial residual polarization charge of the capacitor which consists of the lower electrode 40, the dielectric layer 41, and the upper electrode 42, the residual polarization charge of the capacitor immediately after the opening portions 44a, 44b are formed in the capacitor protection film 43, the residual polarization charge of the capacitor immediately after the oxygen annealing is carried out, and the residual polarization charge of the capacitor immediately after the wiring layers 45a, 45b are formed have been checked. Results of the residual polarization charges are shown in FIG. 9.

More particularly, the residual polarization charge is reduced abruptly when the opening portions 44a, 44b are formed by etching a part of the capacitor protection film 43 after the capacitor protection film 43 is formed, then the residual polarization charge is restored after the oxygen annealing, and then the residual polarization charge is slightly reduced after the wiring layers are formed. Then, after the wiring layers 45a, 45b are formed, the residual polarization charge is not substantially reduced and thus an amount of the residual polarization charge can be maintained.

In this event, the explanation has been made by employing PZT as the dielectric oxide film of the capacitor in the above example. The oxygen is escaped from ferroelectric oxide material (dielectric oxidation) such as PLZT, strontium titanium oxygen (STO) as ferroelectric material to reduce the residual polarization charge and to increase a leakage current, so that there is a possibility that the upper electrode is peeled easily from the dielectric film. Therefore, it is preferable that, even if such ferroelectric oxide material is employed, the oxygen should be supplied to the upper electrode at the concentration of more than $1 \times 10^{20}$ atoms/cm$^3$.

As material for the upper electrode and the lower electrode, noble metal such as ruthenium (Ru), iridium (Ir), palladium (Pd), and others may be employed in addition to platinum.

As described above, according to the present invention, since the oxygen concentration contained in the upper electrode, which is formed on the dielectric oxide film and formed of at least platinum, is set to more than $1 \times 10^{20}$ atoms/cm$^3$, it is possible to make difficult the peeling of the upper electrode from the dielectric oxide film.

In this case, if the oxygen concentration in the dielectric oxide film is set to $5 \times 10^{19}$ atoms/cm$^3$, the residual polarization charge to stabilize the operation of the FeRAM can be achieved.

What is claimed is:

1. A semiconductor device comprising:
    a first insulating layer formed on a semiconductor substrate;
    a capacitor formed on the first insulating layer wherein the capacitor includes, a lower electrode, a dielectric oxide film formed on the lower electrode, and an upper electrode formed on the dielectric oxide film and formed of at least platinum;
    a second insulating layer covering the capacitor; and
    a first opening formed in the second insulating layer and formed on the upper electrode;
    wherein the upper electrode exposed from the opening in the second insulating layer contains oxygen having a concentration of more than $1 \times 10^{20}$ atoms/cm$^3$, and the second insulating layer is formed in a reduction atmosphere.

2. A semiconductor device according to claim 1, wherein the dielectric oxide film is containing oxygen having a concentration of more than $5 \times 10^{19}$ atoms/cm$^3$.

3. A semiconductor device according to claim 1, wherein the dielectric oxide film is formed of a ferroelectric material.

4. A semiconductor device according to claim 3, wherein the dielectric oxide film is formed of PZT or PLZT.

5. A semiconductor device according to claim 1, further comprising:

a first wiring formed on the second insulating layer and electrically contacted with the upper electrode through the first opening;

a second opening formed on the second insulating layer and formed on the lower electrode; and a second wiring formed on the second insulating layer and electrically contacted with the lower electrode through the second opening.

6. A semiconductor device according to claim 1, further comprising a MOS transistor formed on the semiconductor substrate and covered with the first insulating layer.

7. A semiconductor device comprising:

a first insulating layer formed on a semiconductor substrate;

a capacitor formed on the first insulating layer wherein the capacitor includes, a lower electrode, a dielectric oxide film formed on the lower electrode, and an upper electrode formed on the dielectric oxide film and formed of at least a noble metal;

a second insulating layer covering the capacitor; and a first opening formed in the second insulating layer and formed on the upper electrode;

wherein the upper electrode exposed from the opening contains oxygen having a concentration of more than $1\times10^{20}$ atoms/cm$^3$ introduced by annealing, and the second insulating layer is formed in a reduction atmosphere.

8. A semiconductor device according to claim 7, wherein the dielectric oxide film contains oxygen having a concentration of more than $5\times10^{19}$ atoms/cm$^3$.

9. A semiconductor device according to claim 7, wherein the dielectric oxide film is formed of a ferroelectric material.

10. A semiconductor device according to claim 9, wherein the dielectric oxide film is formed of PZT or PLZT.

11. A semiconductor device according to claim 7, wherein the noble metal is formed of platinum, iridium, or ruthenium.

12. A semiconductor device according to claim 7, further comprising:

a first wiring formed on the second insulating layer and electrically contacted with the upper electrode through the first opening;

a second opening formed in the second insulating layer and formed on the lower electrode; and a second wiring formed on the second insulating layer and electrically contacted with the lower electrode through the second opening.

13. A semiconductor device according to claim 7, further comprising a MOS transistor formed on the semiconductor substrate and covered with the first insulating layer.

14. A semiconductor device according to claim 1, wherein the first opening is formed in a reduction atmosphere.

* * * * *